(12) United States Patent
Sullivan et al.

(10) Patent No.: US 7,366,628 B2
(45) Date of Patent: Apr. 29, 2008

(54) COMPRESSED LOGIC SAMPLE STORAGE

(75) Inventors: Steven K. Sullivan, Beaverton, OR (US); Kenneth P. Dobyns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/266,105

(22) Filed: Nov. 2, 2005

(65) Prior Publication Data

US 2007/0100568 A1    May 3, 2007

(51) Int. Cl.
*G06F 19/00* (2006.01)

(52) U.S. Cl. ......................... 702/108; 702/66

(58) Field of Classification Search .................. 702/66, 702/67, 108; 714/25; 712/220; 707/101; 341/55; 386/27, 33
See application file for complete search history.

(56) References Cited

U.S. PATENT DOCUMENTS

| | | | |
|---|---|---|---|
| 4,608,652 A | 8/1986 | Yokokawa | |
| 6,473,700 B1 | 10/2002 | Holaday | |
| 6,748,520 B1 * | 6/2004 | Maynard et al. | 712/220 |
| 6,934,646 B2 * | 8/2005 | Montijo | 702/66 |
| 7,071,852 B1 | 7/2006 | Wegener | |
| 2006/0143518 A1 * | 6/2006 | Cheng et al. | 714/25 |

\* cited by examiner

*Primary Examiner*—John Barlow
*Assistant Examiner*—Douglas N Washburn
(74) *Attorney, Agent, or Firm*—Michael A. Nelson; Francis I. Gray

(57) ABSTRACT

A test and measurement Instrument samples an input digital logic signal to produce logic samples, compresses the logic samples into compression codes, and stores the compression codes into acquisition memory. Compression includes parsing the logic samples into groups and assigning compression codes to those groups, and is performed so as not to lose information about the input digital logic signal's activity. The instrument converts the stored compression codes into a waveform image in display memory and displays the stored waveform image on a display device.

8 Claims, 5 Drawing Sheets

COMPRESSED LOGIC SAMPLE STORAGE

FIELD OF THE INVENTION

The present invention relates generally to test and measurement instruments for digital logic signals, and more specifically to methods of compressing logic samples for storage.

BACKGROUND OF THE INVENTION

Test and measurement instruments such as logic analyzers and mixed signal oscilloscopes are used to measure the logic values of digital logic signals. These instruments sample the logic values of an input digital logic signal at time instants specified by a sampling clock, store the logic samples in an acquisition memory, convert the stored logic samples into a waveform image in display memory, and display the waveform image on a display device.

One limitation of these instruments is their finite acquisition memory capacity. The acquisition memories are standard commercially available random access memories and, as such, are available in fixed capacities such as 64, 128, or 256 Mbytes. For example, the TLA7000 Series Logic Analyzer available from Tektronix, Inc. of Beaverton, Oreg. supports up to 256 Mbytes of acquisition memory.

Users are occasionally interested in observing the behavior of the input digital logic signal over a time interval that exceeds the instrument's acquisition memory capacity. For example, consider a user interested in the behavior of a signal over three seconds, but the user's instrument is acquiring logic samples at 256 Mbytes/sec and has 256 Mbytes of acquisition memory. To display three seconds requires 3×256 Mbytes=768 Mbytes of acquisition memory, three times more than is available. In this situation, instruments typically "decimate" or discard some of the acquired samples to avoid overflowing the memory. For example, the instrument may decimate by a factor of three, storing only one of every three acquired samples and discard the remaining two. The resulting display is "aliased" in that it no longer contains all the sample data, but nonetheless it still provides useful information to the user. However, if the discarded samples contain important information about the signal (e.g. logic transitions) the decimated display misleads the user.

Decimation is a very simple compression method, with the loss of information being a potential user trap. U.S. Pat. No. 6,473,700 to Holaday et al. for an "Apparatus for Use in a Logic Analyzer for Compressing Digital Data for Waveform Viewing" describes a more elaborate compression method. Holaday teaches conditioning a large number of logic samples stored in acquisition memory, for example, 256 Mbytes, for display on a raster scan type display with, for example, 1024 columns. Holaday's compression method parses the logic samples into groups (e.g. 256 Mbytes÷1024=250 k bytes per display column) and assigns each group a compression code based on whether the logic samples in the group were "always high", "always low", or "changed." Holaday's compression method, unlike decimation, does not alias information. That is, in compressing 250 k samples into one display column Holaday does not preserve all of the details of the logic activity, but if, for example, a region contains logic transitions, Holaday accurately reports that the signal "changed," as opposed to decimation which may show that the signal did not change. One might be led to think that Holaday could be applied in place of decimation to solve the memory capacity problem. However, because Holaday's purpose is to condition logic samples already stored in acquisition memory for display on a raster scan display device, Holaday relies on memory addresses corresponding to stored logic samples, and applies those memory addresses to comparators in order to parse the logic samples. In order to alleviate the problem of limited acquisition memory capacity, the logic samples must be compressed before they are stored in acquisition memory, and so Holaday is not applicable.

What is needed is a compression method capable of operating on logic samples as they are acquired, in real time, before they are stored in acquisition memory, thereby allowing an instrument to store more information about an input digital logic signal than finite memory capacity ordinarily allows, without losing important information about the signal activity.

SUMMARY OF THE INVENTION

Accordingly, in the present invention a test and measurement instrument samples an input digital logic signal to produce logic samples, compresses the logic samples into compression codes, and stores the compression codes into acquisition memory. Compression includes parsing the logic samples into groups and assigning compression codes to those groups, and is performed so as not to lose information in the input digital logic signal's activity. The instrument converts the stored compression codes into a waveform image in display memory and displays the stored waveform image on a display device.

The advantages and novel features of the present invention are apparent from the following detailed description when read in conjunction with the appended claims and attached drawing.

DETAILED DESCRIPTION OF THE INVENTION

Figure 1:
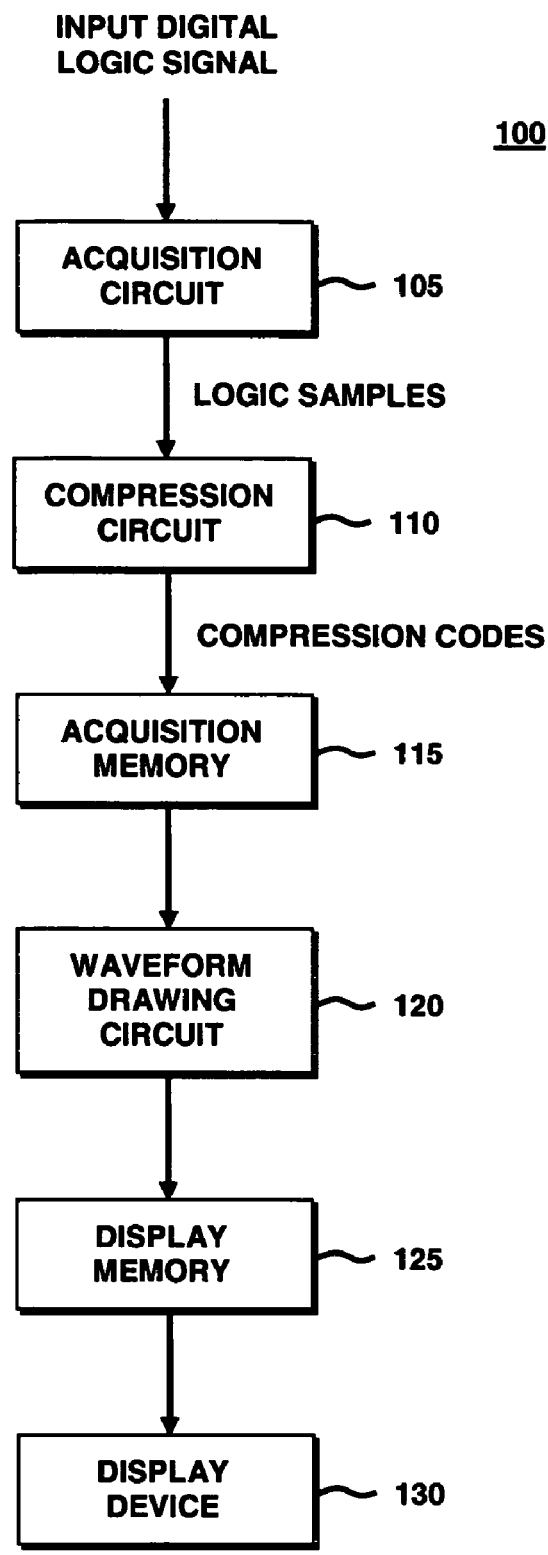
FIG. 1 is a simplified high-level block diagram illustrating an instrument architecture that implements the present invention.

Referring to FIG. 1, acquisition circuit 105 samples an input digital logic signal to produce logic samples by applying the input digital logic signal to one input of a comparator, the other input receiving a voltage corresponding to a decision threshold, and latching the output of the comparator at time instants specified by a sampling clock, as is well known in the art. Compression circuit 110 compresses the logic samples into compression codes, as described below. Acquisition memory 115 stores the compression codes. Waveform drawing circuit 120 produces a waveform image representative of the stored compression codes, which is stored in display memory 125, and then displayed on display device 130. Not shown are a sample clock (distributed to all elements as necessary), control circuitry, and circuitry that stores logic samples into acquisition memory without compression, as is well known in the art. The present invention compresses logic samples before their storage in acquisition memory 115, rather than afterward, as is the case with Holaday, thereby allowing the instrument to overcome the fundamental limitation of its finite acquisition memory capacity.

Figure 2:
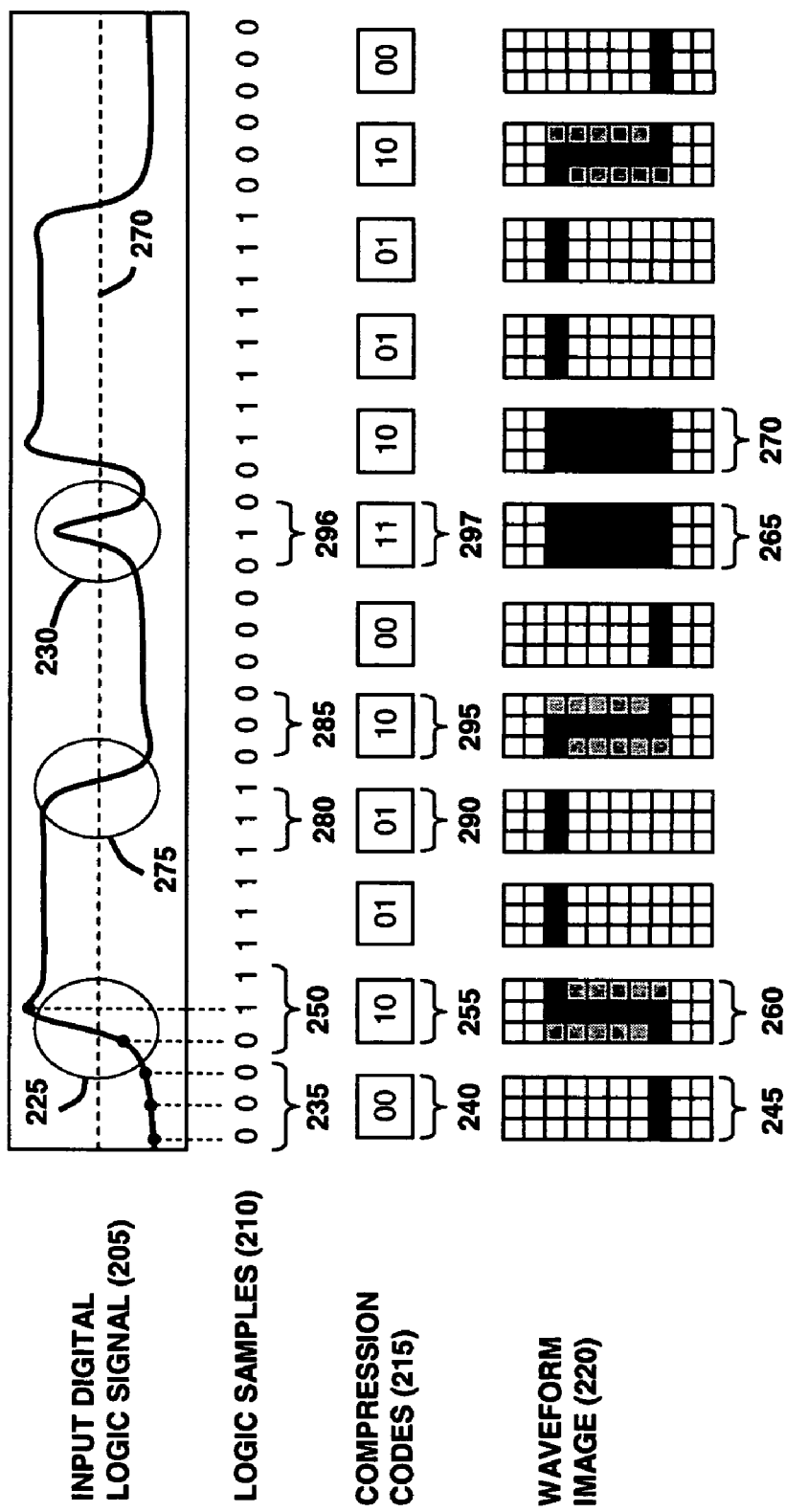
FIG. 2 is an illustration showing an input digital logic signal, logic samples, compression codes, and a waveform image displayed on a display device in accordance with the present invention.

To avoid aliasing, compression circuit 110 must accurately report the input digital logic signal activity, but may sacrifice some information about the precise timing of that activity and even the nature of the activity, depending on the amount of compression used. This behavior can be accomplished using many different compression methods. One such method is to parse the logic samples into groups and assign each group a compression code based on the logic activity of the logic samples in the group. Four such assignments (and their binary representations) are "always high" (01), "always low" (00), "changed once" (10), or "changed multiple times" (11). FIG. 2 illustrates how this method converts logic samples 210 (corresponding to an input digital logic signal 205 and decision threshold 270) in groups of three into compression codes 215. For example, the first group of logic samples 235 (000) is represented by compression code 240 "always low." The second group of logic samples 250 (011) corresponding to rising edge 225 is represented by compression code 255 "changed once." At the first falling edge 275, logic samples 280 (111) and 285 (000) could be assigned "always high" followed by "always low," however the absence of the necessary "single transition" between them is misleading. To provide a more informative display, compression circuit 110 considers not only the logic samples in the immediate group but also the final logic value of the previous group. In this manner, since the last logic state before logic samples 285 (the final logic state of logic samples 280) is a logic one, compression circuit 110 assigns compression code 295 "single transition." Likewise, since the last logic state before logic samples 280 is a logic one, compression circuit 110 assigns compression code 290 "always high." The region of high signal activity 230 is assigned compression code 297 "changed multiple times" since logic samples 296 (010) change logic state more than once.

To convert compression codes 215 into waveform image 220, waveform drawing circuit 120 (implemented in either dedicated circuitry or software running on a processor) produces images representative of the logic activity indicated by the compression codes. For example, compression code 240 "always low" may be represented graphically by waveform image 245 representing a series of logic zeros, with the waveform image in this case being a 10×3 pixel image for simplicity. To produce a waveform image representing compression code 255 "changed once", waveform drawing circuit 120 considers the final logic state of compression code 240 "always low" to determine that waveform image 260 should be rising edge. When a "changed once" group follows a "changed multiple times" group, the information has been lost as to whether the edge should be rising or falling so waveform drawing circuit 120 produces a "changed multiple times" waveform image, as in waveform image 270.

At the first rising edge 225 the compression method loses some information about the precise timing of the signal activity, in that the user is no longer able to discern in between which of the three logic samples 250 the transition occurred, only that it occurred somewhere within that group of three. Likewise, in the region of high signal activity 230 the compression method loses information about the exact nature of the signal transitions. That is, waveform image 265 does not indicate precisely what logic activity occurred, but the user is nonetheless able to discern that the input signal changed more than once.

In FIG. 2, for each group of three logic samples, the instrument uses only two bits of acquisition memory to store the corresponding compression codes, rather than using three bits to store each group of logic samples directly, allowing a 33% reduction in memory usage. For greater memory savings, one may increase the amount of compression by increasing the number of samples in each group.

The compression method of the present invention differs from that employed by Holaday because it recognizes the advantage of including an additional assignment, "changed state multiple times." The additional assignment distinguishes between groups of samples in which many logic transitions occurred and groups of samples in which only one transition occurred, which provides a more useful display for the user. The present compression method is not inherently limited to four assignments, but can be extended to include more assignments.

The present compression method may also be further re-applied to the compression codes after they have been stored in acquisition memory, if necessary, for the purpose of conditioning the stored compression codes for display on a display device.

Figure 3:
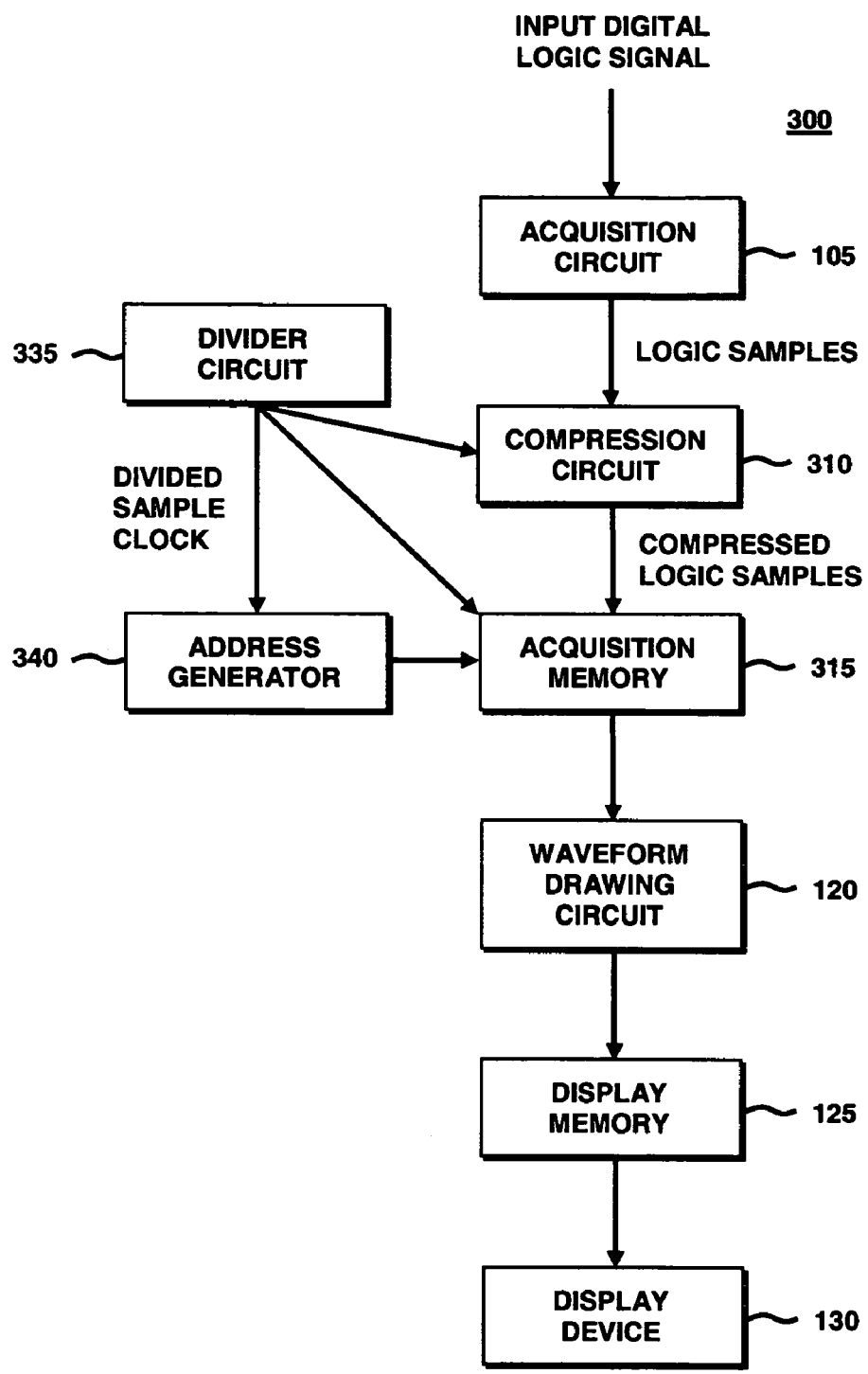
FIG. 3 is a simplified high-level block diagram of an instrument architecture that uses a divider circuit to parse logic samples into groups in accordance with a second embodiment of the present invention.
Figure 4:
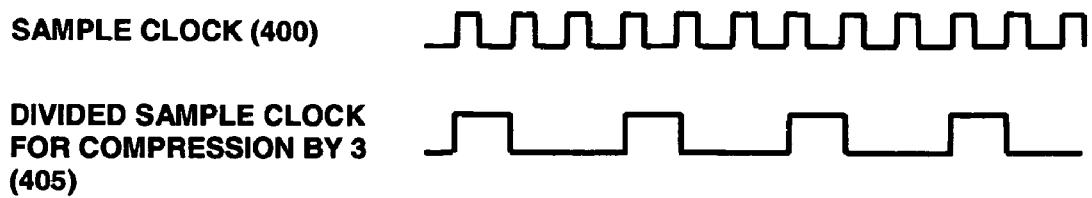
FIG. 4 is a timing diagram showing a relationship between a sample clock and the divider circuit output of FIG. 2 for compression by a factor of three, useful for understanding the invention.

One advantage of the present compression method is that its simplicity makes it straightforward to implement in circuitry that operates at the sample rate of the instrument. FIG. 3 illustrates a simplified high-level block diagram of instrument architecture 300 based on instrument architecture 100 that uses a divider circuit 335 to parse the logic samples into groups. Referring to FIG. 4, divider circuit 335 divides down a sample clock 400 to produce a divided sample clock 405 that is high for one clock cycle and low for a number of cycles, with the time interval between rising edges of the divided clock defining a "compression interval." For compression by a factor of N, the divider output is high for one cycle and then low for N-1 cycles. For example, for compression by a factor of three, the divider circuit output is high for one cycle and then low for two cycles.

Referring again to FIG. 3, each time divider circuit 335 produces a high output, compression circuit 310 starts forming a compression code. Compression circuit 310 continues to develop the compression code, examining the logic samples with every sample clock, while the output of the divider circuit 335 remains low. When divider circuit 335 produces another high output signal the compression code appears at the output of compression circuit 310, causing acquisition memory 315 to accept the compression code and store it at a memory address specified by an address generator 340. Address generator 340 then advances the memory address so that the next compression code is placed into the next memory address.

Figure 5:
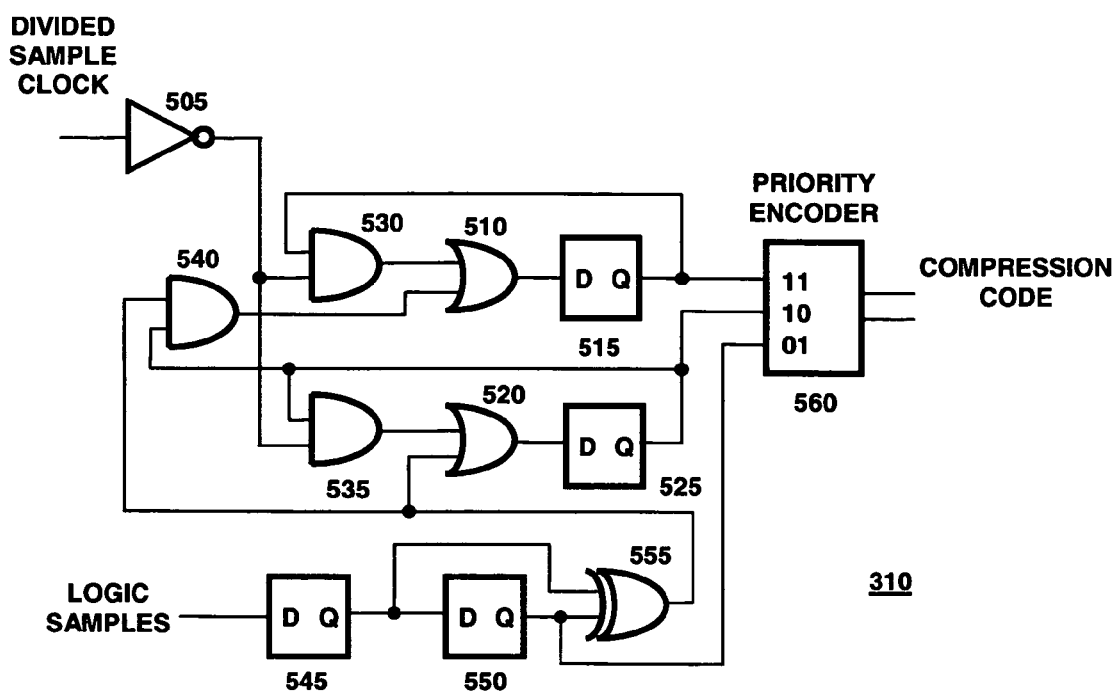
FIG. 5 shows, in simplified schematic form, a circuit that implements the compression circuit of FIG. 3.

FIG. 5 shows a detailed view, in schematic form, of compression circuit 310. Not shown is a sample clock (distributed to all elements as necessary). Compression circuit 310 includes an inverter 505 which inverts the divided system clock and applies it to a first input of an AND-gate 530 and to a first input of an AND-gate 535. The output of AND-gate 530 is connected to a first input of OR-gate 510, and the output of AND-gate 535 is connected to a first input of OR-gate 520. The output of OR-gate 510 is connected to the D of flip-flop 515, and the output of OR-gate 520 is connected to the D of flip-flop 525. The Q of flip-flop 515 is connected a second input of AND-gate 530 and the "11" input of priority encoder 560. The Q of flip-flop 525 is connected a second input of AND-gate 535, the "10" input of priority encoder 560, and a first input of AND-gate 540. Logic samples are applied to the D of flip-flop 545. The Q of flip-flop 545 is applied to a first input of XOR-gate 555 and the D of flip-flop 550. The Q output of flip-flop 550 is applied to a second input of XOR-gate 555 and the "01" input of priority encoder 560. The output of XOR-gate 555 is applied to a second input of OR-gate 520 and a second input of AND-gate 540. The output of AND-gate 540 is applied to a second input of OR-gate 510. Priority encoder 560 produces a 2-bit value equal to its highest asserted input.

In operation, when the divided sample clock goes high, flip-flop 515 and flip-flop 525 are forced low, which causes priority encoder 560 to assign "00" to the compression interval. When logic samples (clocked into compression circuit 310 on every sample clock) change state, the output of XOR-gate 555 goes high, which causes the flip-flop 525 to go high (and remain high for the remainder of the compression interval), which causes priority encoder 560 to assign "10" to the compression interval. If the logic samples change a second time during the compression interval, flip-flop 515 goes high (and remains high for the remainder of the compression interval), which causes priority encoder 560 to assign "11" to the compression interval. If the logic samples are high during the entire compression interval, priority encoder 560 assigns "01" to the compression interval.

Thus, the present invention compresses logic samples as they are acquired, in real time, before they are stored in acquisition memory, thereby allowing an instrument to store more information about an input digital logic signal than its finite memory capacity ordinarily allows, without losing important information about the signal activity.

What is claimed is:

1. A test and measurement instrument for measuring digital logic signals comprising:
    an acquisition circuit that samples an input digital logic signal to produce logic samples;
    a compression circuit that compresses the logic samples into compression codes according to logic activity within consecutive groups of the logic samples, the size of the groups determining an amount of compression; and
    an acquisition memory that stores the compression codes.

2. An instrument as recited in claim 1 further comprising:
    a waveform drawing circuit for converting the stored compression codes into a waveform image;
    a display memory for storing the waveform image; and
    a display device that displays the stored waveform image.

3. An instrument as recited in claim 1 wherein the compression circuit comprises:
    a parsing circuit that parses the logic samples into the groups; and
    an assignment circuit that assigns a specific compression code as the compression code to each of the groups based on the logic activity of the logic samples within the group.

4. An instrument as recited in claim 3 wherein the assignment circuit comprises:
    circuitry assigning a first specific compression code as the compression code if all of the logic samples in the group are high;
    the circuitry assigning a second specific compression code as the compression code if all of the logic samples in the group are low;
    the circuitry assigning a third specific compression code as the compression code if the logic samples in the group changed logic state once; and
    the circuitry assigning a fourth specific compression code as the compression code if the logic samples in the group changed logic state more than once.

5. A method for processing digital logic signals comprising the steps of:
    sampling an input digital logic signal to produce logic samples;
    compressing the logic samples into compression codes according to logic activity within consecutive groups of the logic samples, the size of the groups determining an amount of compression; and
    storing the compression codes into an acquisition memory.

6. A method as recited in claim 5 further comprising the steps of:
    converting the stored compression codes into a waveform image;
    storing the waveform image in a display memory; and
    displaying the stored waveform image on a display device.

7. A method as recited in claim 5 wherein the compressing step comprises the steps of:
    parsing the logic samples into the groups; and
    assigning a specific compression code as a compression code to each of the groups based on the logic activity of the logic samples within the group.

8. A method as recited in claim 7 wherein the assigning step comprises:
    assigning a first specific compression code as the compression code if all of the logic samples in the group are high;
    assigning a second specific compression code as the compression code if all of the logic samples in the group are low;
    assigning a third specific compression code as the compression code if the logic samples in the group changed logic state once; and
    assigning a fourth specific compression code as the compression code if the logic samples in the group changed logic state more than once.

* * * * *